Nov. 21, 1967 F. J. SAIA ET AL 3,354,258

PACKAGE FOR SEMICONDUCTOR DEVICES AND METHOD OF MAKING SAME

Filed July 21, 1965

Frank J. Saia,
Gilbert N. McIntyre,
INVENTORS.

BY.

W. H. McAllister Jr

ATTORNEY.

United States Patent Office 3,354,258
Patented Nov. 21, 1967

3,354,258

PACKAGE FOR SEMICONDUCTOR DEVICES AND METHOD OF MAKING SAME

Frank J. Saia and Gilbert N. McIntyre, Costa Mesa, Calif., assignors to Hughes Aircraft Company, Culver City, Calif., a corporation of Delaware Filed July 21, 1965, Ser. No. 473,779
3 Claims. (Cl. 174—52)

ABSTRACT OF THE DISCLOSURE

Glass-to-metal sealed package for semiconductor devices in which a glass envelope, hermetically sealed to metallic end caps, contains at least 0.2% chromium as by being boiled for ten minutes in a potassium chromate solution having concentration of at least 3%.

Figure 1:
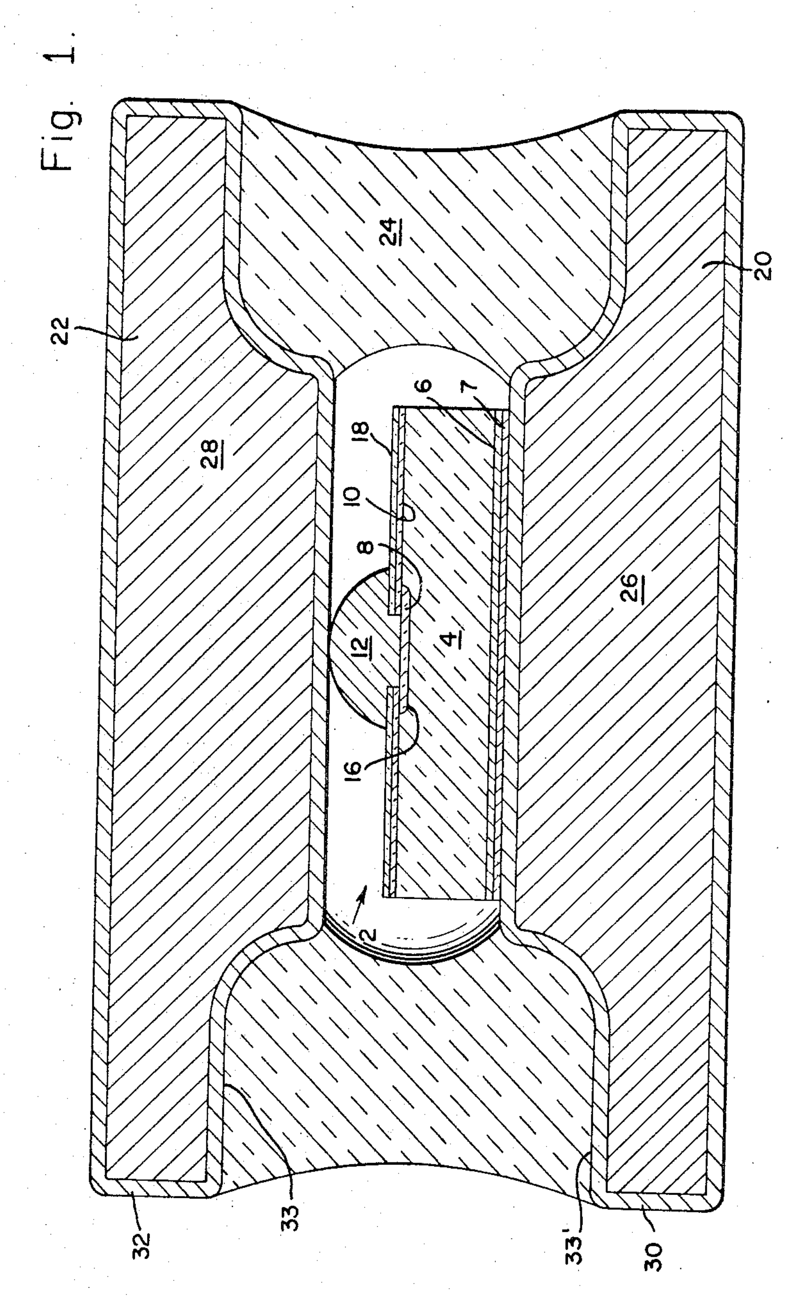

This invention relates to semiconductor devices and especially to junction-type semiconductor diodes. More particularly, the invention relates to the packaging of silicon junction-type diodes and to methods of manufacturing and treating the package or container therefor so as to improve and stabilize the electrical and mechanical properties of the package.

There is currently on the market a diffused junction-type silicon diode having an oxide layer in situ on the surface of the silicon body so as to protect this surface and especially the P-N rectifying junction which terminates at the surface. While the silicon oxide mask is efficacious in protecting the device and in many applications, as in microcircuitry or integrated circuit arrangements, is the only protection needed, there are numerous other applications where additional protection against mechanical damage or detrimental environment is needed. In order to achieve such additional protection, the diode device is provided in an hermetically sealed package comprising a small tubular glass envelope and a pair of metallic end caps. Electrical connections between the diode and the end caps are achieved by contacting or bonding the semiconductor body to the inside surface of one of the end caps and by contacting or bonding the electrode or lead from the diffused junction-forming region on the opposite surface of the body to the inside surface of the other end cap.

In such a package, it will be understood that the metallic end cap members must be capable of forming glass-to-metal seals or bonds as well as metal-to-metal bonds. The metal-to-metal bonds are required between the metallic end cap members and the metallic connections on opposite surfaces of the semiconductor body. The glass-to-metal bonds are required between the ends of the glass envelope and the metallic end caps which, when bonded thereto, form a hermetically sealed package. For this package it is customary to use alloys of iron and nickel in order to achieve good hermetic glass-to-metal seals. However, the relatively rapid and extensive oxidation of end cap members of such materials, which occurs especially during the step of fusing terminal members to the glass envelope, often degrades the desired bonding between these cap members and the respective metallic connections or portions of the semiconductor diode device within the package. Thus, while this oxide and/or its formation on some portions of the cap members during the package sealing step appears to be advantageous as far as attaining the desired glass-to-metal seals is concerned, such oxidation of other portions of the cap members poses a severe disadvantage as far as attaining the desired metal-to-metal seals to the device itself.

One solution to the foregoing package problem eliminates undesired oxidation of the metallic cap members by providing a metal plating on the cap members which does not impair the necessary glass-to-metal bonds. In particular, it is the practice to plate these metal end cap members with silver. Oxidation of this metal plating at the glass-to-metal seal portions of the package appears to be beneficial in obtaining a good bond between the glass and the metal. On the other hand, it has been found that any oxide of the silver plating on the portions of the cap members to be bonded to the diode device itself either disappears as by vaporization or decomposition by the time the metal-to-metal bonding temperatures and/or conditions are reached, or the oxide benefits the metal-to-metal bonding.

The present invention is particularly concerned with the hermetic sealing of the glass package to the metal end caps and to the chemical nature of the bond formed thereat. Thus, while the package or container for such diodes initially appears to have excellent mechanical and hermetic bonding properties due to the presence of the silver oxide at the glass-to-metal seal portions of the package, it has been discovered that this silver oxide "glue" often is subsequently reducible by galvanic action as when the package is subjected to a test in which a saline solution is sprayed on the package for a relatively long period of time (i.e., several hours). This salt spray test is a standard test utilized in the industry to establish the reliability and hermeticity of the package. It has also been found that under certain electrical stresses as established by operating the thus-packaged silicon diode at certain potentials, the silver oxide is similarly reducible, apparently by hydrogen generated cathodically. Probably the silver oxide is also reduced by hydrogen generated galvanically in salt spray. At any rate, the reduction of the silver oxide at the glass-to-metal seal portions of the package considerably weakens the mechanical strength and hermeticity of the seals formed. In a co-pending application, S.N. 473,706, filed concurrently herewith and assigned to the instant assignee, the inventors (A. Gee and R. E. Alexander) describe a technique for reducing or altogether inhibiting reduction by galvanic action of the materials involved in the glass-to-metal seals of the package. However, this technique does not completely prevent reduction of the silver oxide by cathodic action when the thus-packaged silicon diode is subjected to certain electrical stresses. According to the method described in the aforementioned co-pending application by Gee and Alexander, the improvement against galvanic reduction in the glass-to-metal seal is achieved by incorporating chromium in the seal. One of the methods taught therein for providing the chromium is by boiling the body glass portion of the package in a 1% solution of potassium chromate so that a film is formed on the glass part containing at least about 0.1% by weight of chromium.

It is therefore an object of the present invention to provide an improved packaged for semiconductor devices.

Another object of the invention is to provide an improved package for semiconductor devices wherein package hermeticity is attained by the use of glass-to-metal seals between metal and glass portions of the package.

Another object of the invention is to provide an improved package for semiconductor diode devices in which electrical connections to the diode device are provided by metal-to-metal bonds between the diode device and metallic portions of the package while the mechanical strength and hermeticity of the package are achieved by glass-to-metal bonds to these metallic portions of the package.

Still another object of the invention is to provide an improved method for hermetically sealing a semiconductor device within a package by glass-to-metal seals.

Yet another object of the invention is to provide an improved method for treating the glass body portion or the metal end cap portions of the package so as to reduce or altogether inhibit reduction, not only by galvanic action but also by electrical or other stress factors, of materials involved in the glass-to-metal seals of the package.

These and other objects and advantages of the invention are achieved by introducing chromium into the glass-to-metal seal portions of the package. The chromium may be introduced into these portions by treating the glass body portions with a boiling aqueous solution of from 3 to 15% potassium chromate. By this treatment, the glass body portion of the package includes from about 0.2% to about 0.5% chromium of the total weight thereof. Glass-to-metal seals formed with glass bodies thus treated exhibit resistance to galvanic reduction as well as to electrical stress reduction. It has also been found that an unexpected marked improvement in the electrical stability of the semiconductor and diode device itself is attained when a device is packaged in a container as described utilizing a glass body portion treated in accordance with the practice of the present invention. In another copending application, S.N. 462,357, filed June 8, 1965 and assigned to the instant assignee, Dr. Allen Gee describes a high voltage, high temperature degradation in glass-packaged, oxide-protected diffused junction silicon diodes. More specifically, this degradation in the electrical properties of the device appears to occur when the device is operated with the reverse voltage of 50 volts in the temperature range of 90° C. to 200° C. In the second-mentioned application of Dr. Gee, the method of treating a glass body portion of the package with phosphorous pentoxide or arsenic trioxide or phosphorous oxychloride is taught as one method to prevent this degradation. It is suspected that the degradation is due to the migration of ions from the glass body portion of the package to the region of the rectifying junction underlying the oxide protective surface. For some reason not clearly understood at this time, the incorporation of potassium chromate into the glass body portion in amounts in accordance with the present invention unexpectedly appears to inhibit or altogether prevent such migration. At any rate, it has been noted that diffused silicon diodes which were previously subject to this high voltage, high temperature degradation when packaged as described no longer exhibit this temperature-voltage degradation when the glass body portion of the package is treated in accordance with the present invention.

Figure 2:
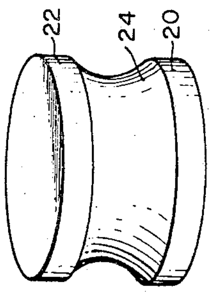

The invention will be described in greater detail by reference to the drawings in which:

FIGURE 1 is a cross-sectional elevational view of a typical diode device mounted in a hermetic glass-metal sealed package treated according to the practice of the present invention; and FIGURE 2 is an over-all perspective view of the packaged diode device shown in FIGURE 1.

Referring now to the drawings, a typical semi-conductor diode device is shown completely packaged and processed according to the invention. The diode device 2 may comprise, for example, a silicon crystal member 4, the bulk of which may be of N-type conductivity. The "back" surface of the silicon member or die 4 may be provided with a bonded metallic connection comprising a gold-silicon eutectic layer 6 by processing techniques well known in the art of semiconductor device fabrication in order to insure a good ohmic connection to the N-type semiconductor die 4. The gold-silicon eutectic layer 6 may be provided by evaporating a thin layer of gold onto the back surface of the silicon body while maintaining this body at the gold-silicon eutectic temperature. Thereafter, by conventional techniques, a thin layer 7 of silver may be electro-deposited on the gold-silicon layer 6.

The remainder of the diode device 2 comprises a diffused P-type junction-forming region 8 disposed on an upper surface of the semiconductor die 4 with protective non-conductive coatings 10 and 18 disposed over portions thereof including especially those portions where the junction 16 between the P-type region 8 and the bulk of the N-type body 4 extends to the surface of the semiconductor die. This junction-forming P-type region 8 is formed prior to assembly of the device 2 in the package by masking the upper surface of the silicon die 4 to form a non-conductive coating 10 as by oxidizing this surface. A portion of this coating may then be removed, as by etching, to form an opening or window therein. Thereafter the thus-masked surface of the semiconductor die is exposed to a diffusion atmosphere containing in vapor form a P-type impurity such as boron, for example. By the process of diffusion, the impurity establishes the P-type region 8 through the opening in the mask. The P-N rectifying junction 16 is thus formed under the protective oxide layer 10 which is left in situ. This process is well known in the art and is fully described in U.S. Patents 2,802,760 to Derick and Frosch and 3,025,589 to Hoerni. An additional layer 18 of insulating material such as pyrolytically deposited silicon oxide or glass may be provided over the initial silicon oxide mesh layer 10 if desired to enhance the protection of this surface of the silicon die 4.

Electrical contact to the P-type region 8 is provided by means of a metal fill or "bump" 12 through openings provided in the non-conductive coatings 10 and 18. Semiconductor devices such as shown are extremely small, the area of the surface of the die member 4 containing the junction-forming region 8 being about 400 sq. mils. In such a device, it is customary that the opening in the non-conductive mask coatings 10 and 18 be only about 3.5 mils in diameter. Electrical connection to the exposed surface of the die member through the window in the non-conductive coatings 10 and 18 is provided by electroplating.

The package or container for the diode device just described comprises a pair of opposed terminal cap members 20 and 22 sealed together at their peripheries by means of a glass body portion or envelope 24 with the semiconductor device 2 therewithin and therebetween. The cap members 20 and 22 are of metal and are each provided with centrally disposed mesa or pedestal portions 26 and 28, respectively.

A suitable glass for the package shown in FIGURE 1 may be a high lead glass identified as "Glass Code 8870," by Corning Glass Works of Corning, New York, the manufacturer thereof. The metallic end cap members 20 and 22 may be formed of a glass-sealing metal consisting essentially of an alloy of iron and nickel in equal proportions by weight. During the heating of the glass body 24 in contact with such an alloy element, however, the cap members tend to readily oxidize which would severely reduce the ability to achieve metal-to-metal bonds or soldering action to such end cap members. It has thus been found advantageous to plate these end cap members with silver so as to inhibit or avoid the deleterious effects of such oxidation of the metal of these cap members while at the same time achieving excellent sealing of the glass body part to these cap members. In addition, the silver plating readily bonds with the metals forming the contact portions or connections on the semiconductor device 2. As shown in the drawings, the end cap members 20 and 22 are provided with platings 30 and 32 by conventional silver electroplating techniques over their entire surfaces which plating may be about 0.0007" in thickness.

The package assembly shown in the drawing is achieved by placing the silicon semiconductor device 2 on the pedestal portion 26 of an end cap member 20 with the silver-plated layer 7 of the semiconductor device 2 being in contact with the silver layer 30 on the mesa portion 26 of the cap member 20. The ringlike glass part 24 is then placed on the peripheral portions of the cap member 20 and the upper cap member 22 is placed with its pedestal portion 28 extending downwardly within the glass member 24. The assembly is then placed in an oven or any other desired heating apparatus and raised to a temperature at which the glass body 24 softens and seals to the metallic cap members 20 and 22. During this sealing operation the glass body 24 loses its heretofore substantially symmetrical, cylindrical shape and tends to slump down to assume more or less the shape shown in the drawing. This slumping down of the glass body 24 permits the upper cap member 22 to drop downwards toward the lower cap member 20 so that the silver-plated pedestal 28 of the upper cap member 22 contacts and bonds to the metal button or "bump" element 12 on the semiconductor device 2. To enhance this action and to ensure that the upper cap member does in fact come down sufficiently to ensure contact to the metal connector 12, it may be desirable to place a weight on the assembly during this heating operation.

Utilizing metal cap members of the aforementioned alloy and a glass body 24 of Corning Glass Number 8870, an hermetically sealed package may be obtained and bonded connections provided between the upper cap member 22 to the connector element 12 and between the lower cap member 20 and the back surface 6 of the semiconductor device by heating the assembly to about 710° C. for three to five minutes.

After mounting and sealing such devices in the package shown and described, it is customary as mentioned previously to subject the package device to a test commonly referred to as the "salt spray test," the purpose of which is to establish the reliability of the package in detrimental environments. The test usually requires subjecting the device to a continuous spray bath of sodium chloride for 16 to 48 hours. It has been noted that a severe degradation in the mechanical strength and hermeticity of the glass-to-metal seals between the end caps and the glass body portion of the package occurs for a substantial number of devices after this test. It is believed that the brine solution involved in this test sets up a galvanic action at the glass-to-metal seal portions which generates hydrogen and reduces the silver oxide at these glass-to-metal seal portions. This galvanic action and the ensuing reduction of the oxide appears to considerably weaken the seal. Furthermore, when such packaged diode devices are subjected to a stress of 2 to 3 volts, for example, across the end cap members 20 and 22, a cathodic reduction of the silver oxide apparently occurs which likewise degrades the glass-to-metal seals. By the process of the present invention, however, it has been found that such degradation may be entirely eliminated or substantially reduced to the point where manufacture of such diode devices in the package described is economically feasible. In addition, the aforementioned temperature-voltage breakdown or degradation of the diode device itself is avoided or overcome to a considerable extent by the practice of the present invention. These improvements are achieved by introducing chromium in the seal between the glass and the metal. The exact mechanism by which the chromium inhibits the aforementioned reduction of the silver oxide is not fully understood at this time, nor is it clear why the temperature-voltage degradation effect is reduced or eliminated.

According to the present invention chromium may be provided in the glass-to-metal seal areas or portions 33 and 33' by placing the glass body portion 24 (which may be formed of the aforementioned high lead glass identified as "Glass Code 8870" by the manufacturer thereof) in an aqueous solution consisting essentially of 7½% potassium chromate. This solution with the glass body part or parts 24 therein is heated to the boiling point of the solution and this temperature is maintained for about 10 minutes or until the glass becomes yellow to green in color. Thereafter the glass body parts 24 may be removed from the solution and dried and are ready for assembly in the package arrangement as shown and described previously. As mentioned previously, solutions of from 3 to 15% potassium chromate may be satisfactorily employed in the practice of the process of the invention.

In addition to potassium chromate, sodium chromate as well as potassium or sodium dichromate or other hexavalent salts of chromium may be employed. In contrast to the previously identified teaching of Gee and Alexander who provided about 0.1% of chromium in the glass parts, the practice of the present invention achieves the incorporation of from about 0.2 to about 0.3% by weight of chromium in the glass. By the incorporation of such an amount of chromium both galvanic and cathodic reduction of the glass-to-metal seal portions of the package are reduced or altogether inhibited as well as the tendency of such packaged diodes to breakdown under the temperature-voltage conditions previously described.

Glass body parts treated and processed as described herein thus form excellent glass-to-metal bonds which, after assembly into the previously described package, are practically impervious to any galvanic action as the result of the salt spray test as well as to cathodic action due to voltage stress conditions. In addition, the diode device itself is unexpectedly found to be much more immune to breakdown due to certain temperature-voltage conditions.

There thus has been described a novel and unexpectedly useful treatment for packaging semiconductor devices in a package including a glass body portion which must be hermetically sealed to metallic end cap members.

What is claimed is:

1. Semiconductor apparatus comprising:
(A) a container including:
 (1) a hollow body portion of glass containing at least 0.2% by weight of chromium;
 (2) metallic end cap members bonded to the end portions of said glass body and forming hermetic glass-to-metal seals therewith;
(B) and a semiconductor device mounted within said container and electrically connected to said metallic end cap members.

2. Apparatus according to claim 1 wherein said metallic end cap members have a layer of silver thereon forming said hermetic glass-to-metal seals with said end portions of said glass body portion.

3. Semiconductor apparatus comprising:
(A) a container including:
 (1) a hollow glass body portion treated for at least 10 minutes with a boiling solution of potassium chromate having a concentration of at least 3%;
 (2) silver-plated metallic end cap members bonded to the end portions of said glass body and forming hermetic glass-to-metal seals between said glass body and the silver plating on said cap members;
(B) and a semiconductor device mounted within said container and bonded to said metallic end cap members in electrically conducting relationship therewith.

References Cited

UNITED STATES PATENTS 2,904,456 9/1959 Nolte.

3,226,466 12/1965 Martin ---------------- 174—15
3,238,425 3/1966 Geyer.

FOREIGN PATENTS 144.808 1/1952 Australia.

LEWIS H. MYERS, *Primary Examiner.*

D. A. TONE, *Assistant Examiner.*